(12) United States Patent
Yano

(10) Patent No.: US 9,672,922 B2
(45) Date of Patent: Jun. 6, 2017

(54) NON-VOLATILE SEMICONDUCTOR MEMORY DEVICE

(71) Applicant: Winbond Electronics Corp., Taichung (TW)

(72) Inventor: Masaru Yano, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/141,812

(22) Filed: Apr. 28, 2016

(65) Prior Publication Data

US 2017/0117046 A1  Apr. 27, 2017

(30) Foreign Application Priority Data

Oct. 22, 2015 (JP) .................................. 2015-207736

(51) Int. Cl.
*G11C 16/10* (2006.01)
*G11C 16/26* (2006.01)
(Continued)

(52) U.S. Cl.
CPC .......... *G11C 16/10* (2013.01); *G11C 16/0483* (2013.01); *G11C 16/16* (2013.01); *G11C 16/26* (2013.01)

(58) Field of Classification Search
CPC ......... G11C 16/10; G11C 16/16; G11C 16/26; G11C 16/0483
See application file for complete search history.

(56) References Cited

U.S. PATENT DOCUMENTS 5,969,990 A * 10/1999 Arase ................... G11C 7/18
257/E27.103
8,120,959 B2 * 2/2012 Lee .......................... G11C 8/12
365/185.13
(Continued)

FOREIGN PATENT DOCUMENTS

JP  2012027979  2/2012
JP  5550609  7/2014
KR  20100110766  10/2010

OTHER PUBLICATIONS

Pin-Yao Wang et al., "Non-Volatile Semiconductor Memory Device and Erasing Method Thereof", Unpublished U.S. Appl. No. 15/140,509, filed Apr. 28, 2016. The specification, claims, and the drawings of the unpublished pending U.S. application.
(Continued)

*Primary Examiner* — Tri Hoang
(74) *Attorney, Agent, or Firm* — Jianq Chyun IP Office

(57) ABSTRACT

A non-volatile semiconductor memory device having an improved layout structure to achieve low power consumption, high speed and miniaturization is provided. A flash memory of the present invention includes a memory array formed with NAND type strings. The memory array includes a plurality of global blocks, one global block includes a plurality of blocks, and one block includes a plurality of NAND type strings. A plurality of local bit lines are shared by each of the plurality of blocks in one global block, a plurality of global bit lines are shared by the plurality of global blocks, and a connecting element selectively connecting one global bit line to n local bit lines is included. When a read-out operation and program operation are executed, one global bit line is shared by n local bit lines.

21 Claims, 11 Drawing Sheets

(51) Int. Cl.
*G11C 16/04* (2006.01)
*G11C 16/16* (2006.01)

(56) References Cited

U.S. PATENT DOCUMENTS

| 9,019,764 B2 | 4/2015 | Lee et al. |
| 9,245,639 B1 * | 1/2016 | Lee ................. G11C 16/26 |
| 2015/0117103 A1 * | 4/2015 | Rhie ................. G11C 8/08 |
| | | 365/185.11 |

OTHER PUBLICATIONS

Office Action of Korean Counterpart Application, issued on Jan. 17, 2017, with English translation thereof, p1-p9.
"Office Action of Taiwan Counterpart Application," issued on Jan. 24, 2017, p1-p10.

* cited by examiner

⊠ : Contact region

| | GBL1 | GBL2 | ... | GBLn-1 | GBLn |
|---|---|---|---|---|---|
| 220 | ⊠ | ⊠ | First switching circuit | ⊠ | ⊠ |
| G_BLK1 | | | Block 0-127 | | |
| 230 | ⊠ | ⊠ | Second switching circuit | ⊠ | ⊠ |
| 220 | ⊠ | ⊠ | First switching circuit | ⊠ | ⊠ |
| G_BLK2 | | | Block 128-255 | | |
| 230 | ⊠ | ⊠ | Second switching circuit | ⊠ | ⊠ |
| | | | ⋮ | | |
| 220 | ⊠ | ⊠ | First switching circuit | ⊠ | ⊠ |
| G_BLK8 | | | Block 896-1023 | | |
| 230 | ⊠ | ⊠ | Second switching circuit | ⊠ | ⊠ |

FIG.5

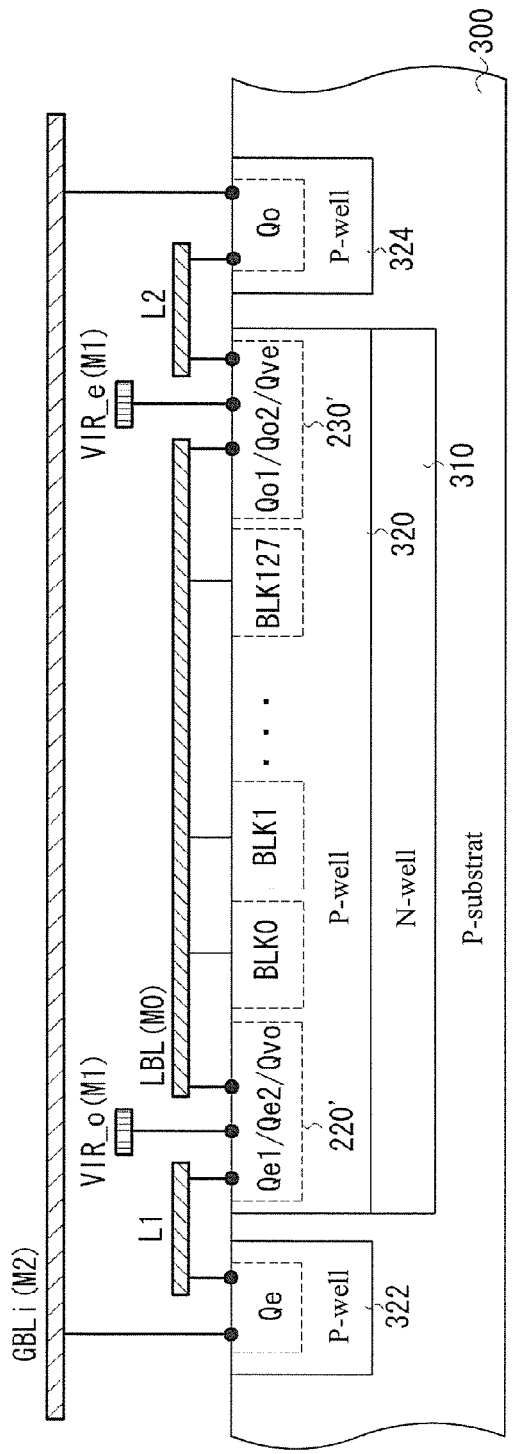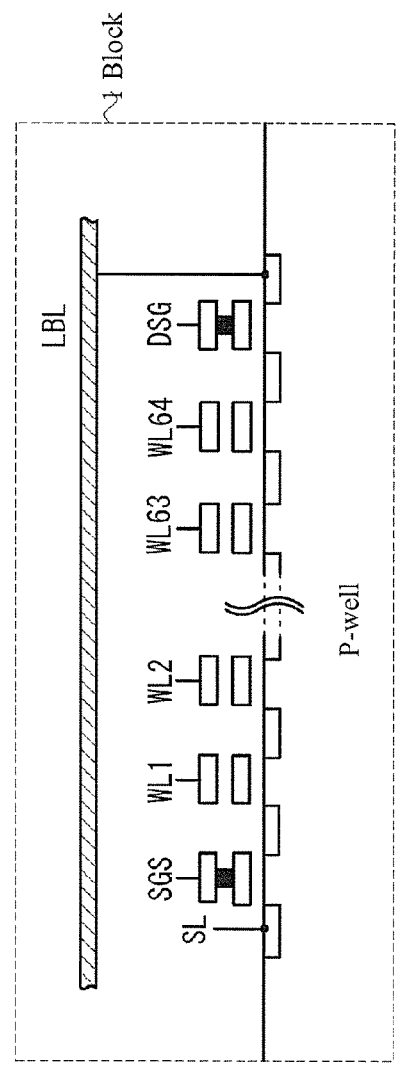
FIG.7(A)
FIG.7(B)

NON-VOLATILE SEMICONDUCTOR MEMORY DEVICE

CROSS-REFERENCE TO RELATED APPLICATION

This application claims the priority benefit of Japan application serial no. 2015-207736, filed on Oct. 22, 2015. The entirety of the above-mentioned patent application is hereby incorporated by reference herein and made a part of this specification.

BACKGROUND OF THE INVENTION

Field of the Invention

The invention relates to a non-volatile semiconductor memory device, especially relates to a structure of a memory array having Not AND (NAND) type string memory cell.

Description of Related Art

Flash memory is a memory element that is applied to a wide variety of electronic equipments, such as digital camera, smartphone, etc. In the market, the flash memory is further required to be small in volume and large in capacity, and is further required to have high speed and low power consumption.

The NAND type flash memory has a memory array configured to have a plurality of blocks, the block is formed by configuring a plurality of NAND strings in column direction. The NAND string is formed by a plurality of memory cells connected in series and select transistors connected to two ends of the series, wherein one end is connected to the bit line via a bit line side select transistor, and another end is connected to the source line via a source line side select transistor.

FIG. 1 is as diagram indicating a structure of a bit line select circuit of a conventional flash memory (Patent document 1). As shown in FIG. 1, a bit line select circuit 10 includes a first select element 12 and a second select element 14, the first select element 12 is configured to connect an even-numbered bit line GBL_e and an odd-numbered bit line GBL_o to a page buffer/sense circuit, the second select element 14 applies a specified bias voltage to the even-numbered bit line GBL_e and the odd-numbered bit line GBL_o. The first select element 12 has an even-numbered select transistor SEL_e connected to the even-numbered bit line GBL_e, an odd-numbered select transistor SEL_o connected to the odd-numbered bit line GBL_o, and a bit line select transistor BLS connected between the sense circuit and a common node N1 of the even-numbered bit line GBL_e and the odd-numbered bit line GBL_o. The transistors SEL_e, SEL_o, and BLS forming the first select element 12 are N channel metal oxide semiconductor transistors formed in P-wells of peripheral circuits forming the page buffer/sense circuit, these transistors are high voltage transistors that are able to operate in a high voltage condition.

For example, when the read-out operation of the page is executed and the even-numbered bit line GBL_e is selected, the even-numbered select transistor SEL_e and the bit line select transistor BLS are turned on, the odd-numbered bit line GBL_o is non-selected, and the odd-numbered select transistor SEL_o is turned off. In addition, when the odd-numbered bit line GBL_o is selected, the odd-numbered select transistor SEL_o and the bit line select transistor BLS are turned on, the even-numbered bit line GBL_e is non-selected, and the even-numbered select transistor SEL_e is turned off.

The second select element 14 has an even-numbered bias transistor YSEL_e connected between the even-numbered bit line GBL_e and an imaginary electric potential VPRE, and an odd-numbered bias transistor YSEL_o connected between the odd-numbered bit line GBL_o and the imaginary electric potential VPRE. These transistors are NMOS transistors formed in P-wells having memory cells and are low voltage transistors that are able to operate in a low voltage condition. A bias voltage corresponding to operate condition or a precharge voltage are provided to the imaginary electric potential VPRE. For example, when the read-out operation of the page is executed, the even-numbered bias transistor YSEL_e of the selected even-numbered bit line GBL_e is turned off, the odd-numbered bias transistor YSEL_o of the non-selected odd-numbered bit line GBL_o is turned on, and a mask voltage is provided to the imaginary electric potential VPRE. In addition, when the even-numbered bit line GBL_e is non-selected and the odd-numbered bit line GBL_o is selected, the even-numbered bias transistor YSEL_e is turned on, the odd-numbered bias transistor YSEL_o is turned off, and the mask voltage is provided to the even-numbered bit line GBL_e. When the program operation is executed, a program inhibit voltage is provided to the imaginary electric potential VPRE, a write inhibit voltage is provided to the channel of the memory cell of the non-selected bit line. Via the transistors of the second select element 14 being formed in the well shared by the memory cells, the area occupied by the bit line select transistors may be reduced to compact the flash memory.

In the future, along with the popularity of internet devices, power consumption of the electronic equipment will be restricted, and high-speed data communication between electronic equipments will be further desired. Consequently, the flash memory powered by the electronic equipment is also further required to have low power consumption, high speed, and miniaturization. The layout structure in the patent document 1 (Japan Patent Publication No. 5550609) is one solution, but this structure is an insufficient solution, and thus the flash memory needs being further improved.

SUMMARY OF THE INVENTION

The invention provides a non-volatile semiconductor memory device having an improved memory array structure to achieve low power consumption, high speed and miniaturization, so as to solve conventional problems.

The non-volatile semiconductor memory device of the invention includes: a memory array including a plurality of global blocks, wherein one global block includes a plurality of blocks, one block includes a plurality of NAND type strings; a plurality of local bit lines, collectively connected to each of the plurality of blocks in one global block; a plurality of global bit lines shared by the plurality of global blocks; and a connecting element selectively connecting the global bit line to m (m is an integer greater than 2) local bit lines, when a read-out operation or a program operation of a selected page is executed in a selected block in the global block, one global bit line is shared by m local bit lines via the connecting element.

According to the invention, one global bit line shared by the plurality of global blocks and one local bit line shared by a plurality of blocks in one global block are separated, and one global bit line is shared by m local bit lines, thereby achieving low power consumption, high speed and miniaturization.

BRIEF DESCRIPTION OF THE DRAWINGS

FIG. 5 is a diagram illustrating a schematic structure of a global block in the memory array of the present embodiment.

FIG. 7(A) is a cross-sectional view of the schematic structure of the global block in the present embodiment, FIG. 7(B) is a cross-sectional view illustrating a connection relationship between a local bit line and a block.

DESCRIPTION OF THE EMBODIMENTS

Embodiments of the invention are described in detail below with reference of figures. Moreover, it should be noticed that in the figures, some parts are emphasized for easy understanding and are not necessarily drawn to scale.

Figure 1:
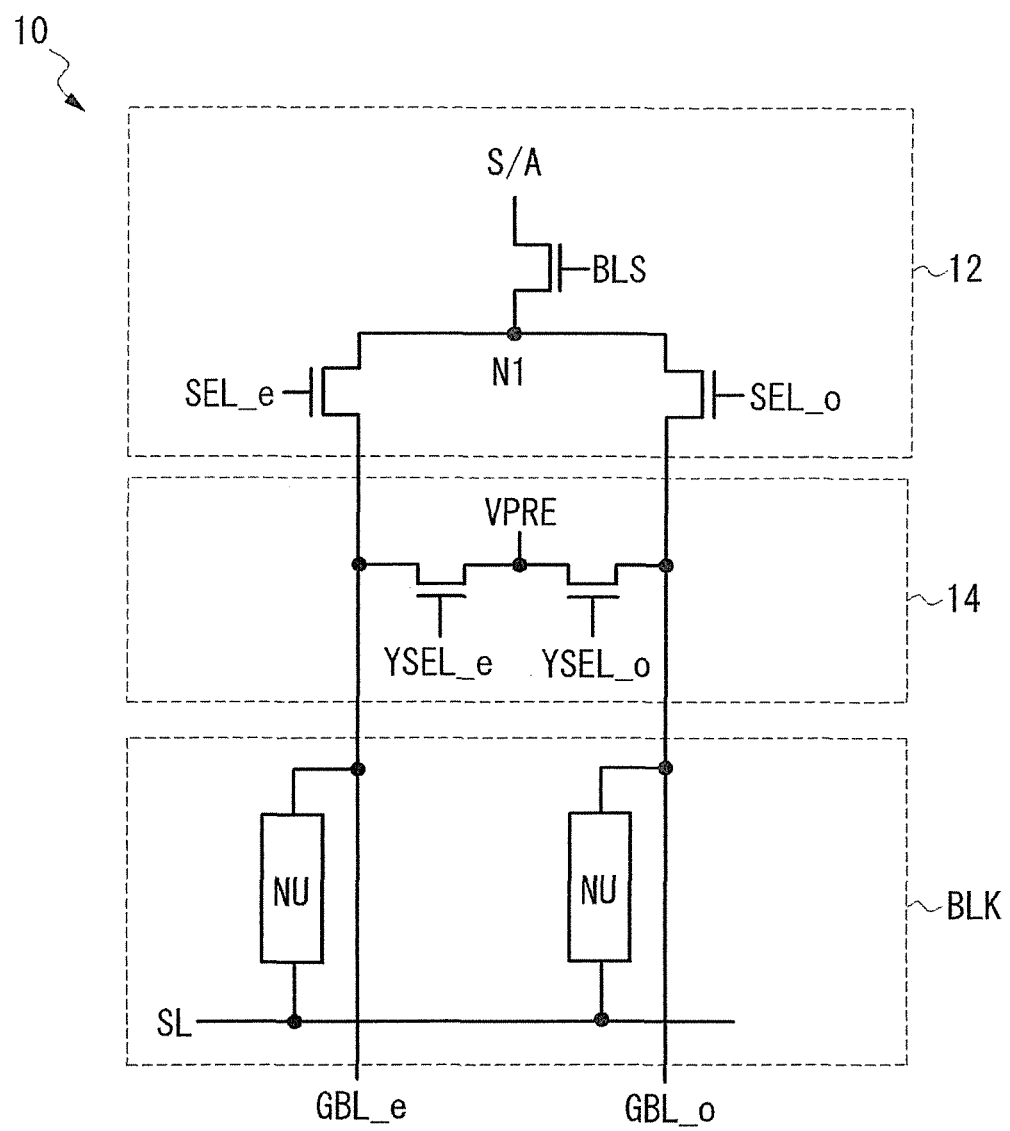
FIG. 1 is as diagram indicating a structure of a bit line select circuit of a conventional flash memory.
Figure 2:
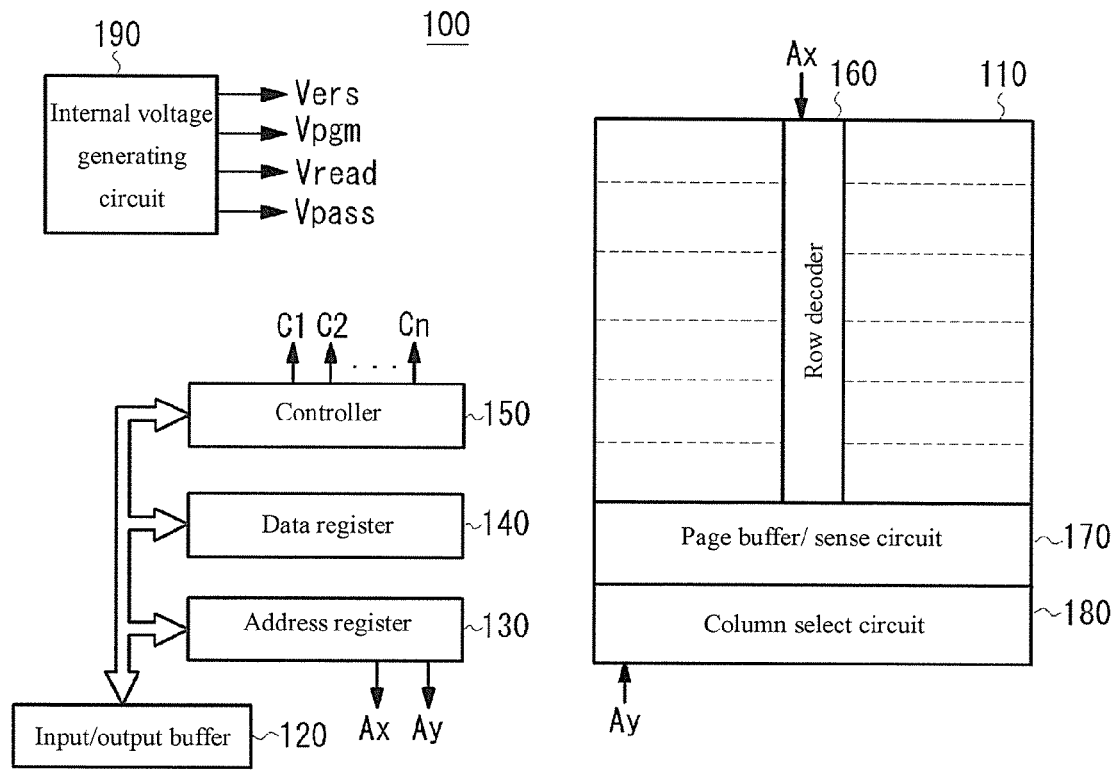
FIG. 2 is a diagram illustrating a schematic structure of a flash memory of an embodiment of the invention.

FIG. 2 is a block diagram illustrating the structure of a NAND type flash memory of an embodiment of the invention. A flash memory 100 in the present embodiment includes a memory array 110 having a plurality of memory cells arranged in a matrix; an input/output buffer 120 connected to the external input/output terminals I/O and maintaining input/output data; an address register 130 receiving address data from the input/output buffer 120; a data register 140 maintaining input/output data; a controller 150 providing control signals C1, C2, . . . Cn, wherein the control signals C1, C2, . . . Cn are used to control each part based on command data from the input/output buffer 120 and an external control signal (a chip enabling signal or an address latch enabling signal, etc., not shown); a row decoder 160 decoding a row address data Ax from the address register 130, wherein a decoding result is based on to select global block or word line, etc.; a page buffer/sense circuit 170 maintaining data read via the bit line or maintaining a program data via the bit line, etc.; a column select circuit 180 decoding a column address data Ay from the address register 130, wherein a decoding result is based on to select bit line, etc.; an internal voltage generating circuit 190 generating voltages required for data reading, data programming and data erasing, etc. (a program voltage Vpgm, a pass voltage Vpass, a read-out voltage Vread, and an erase voltage Vers, etc.).

Figure 3:
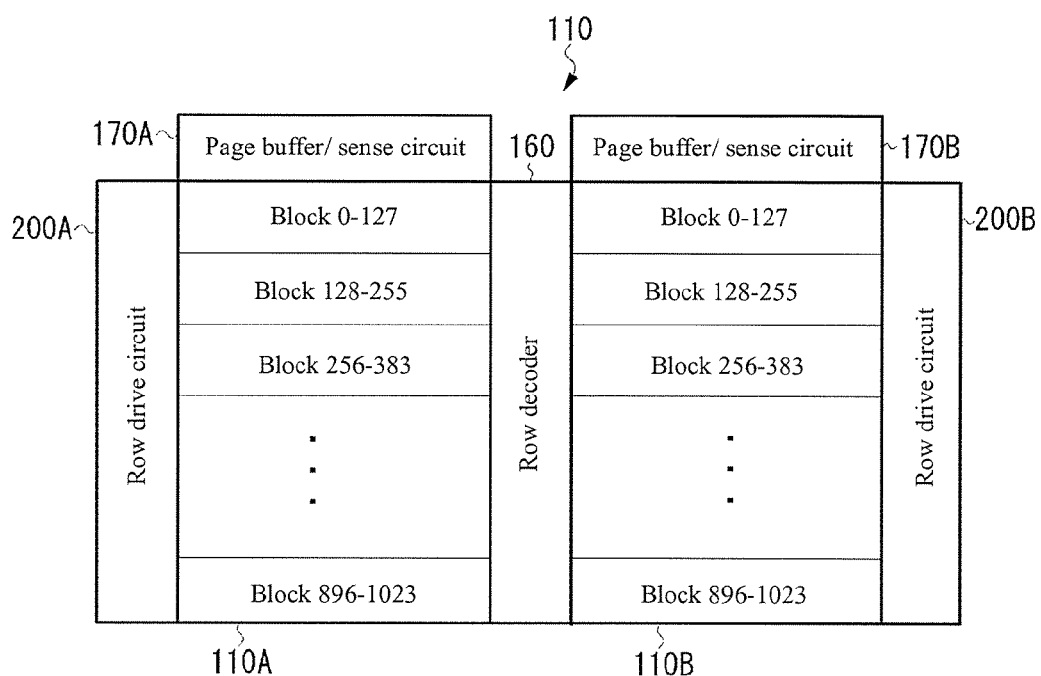
FIG. 3 is a diagram illustrating an entire structure of a memory array in the present embodiment.

FIG. 3 is a diagram illustrating the detailed structure of the memory array 110. The memory array 110 of the present embodiment is divided into two memory banks or two memory planes 110A and 110B. The memory plane 110A is coupled to a row drive circuit 200A, the memory plane 110B is coupled to a row drive circuit 200B, and the row decoder 160 is commonly coupled to the two memory planes 110A and 110B. In addition, as shown in FIG. 3, the top side of the memory plane 110A is configured to have a page buffer/sense circuit 170A, the top side of the memory plane 110B is configured to have a page buffer/sense circuit 170B, however, the page buffer/sense circuits 170A and 170B may also be configured at the bottom sides of the memory planes 110A and 110B.

The memory plane 110A includes a plurality of global blocks GBLK disposed along the column direction, similarly, the memory plane 110B may also include a plurality of global blocks GBLK disposed along the column direction. One global block GBLK further includes a plurality of blocks. As shown in FIG. 3, the memory plane 110A (or 110B) includes 8 global blocks GBLK along the column direction, one global block GBLK further includes 128 blocks BLK.

Figure 4:
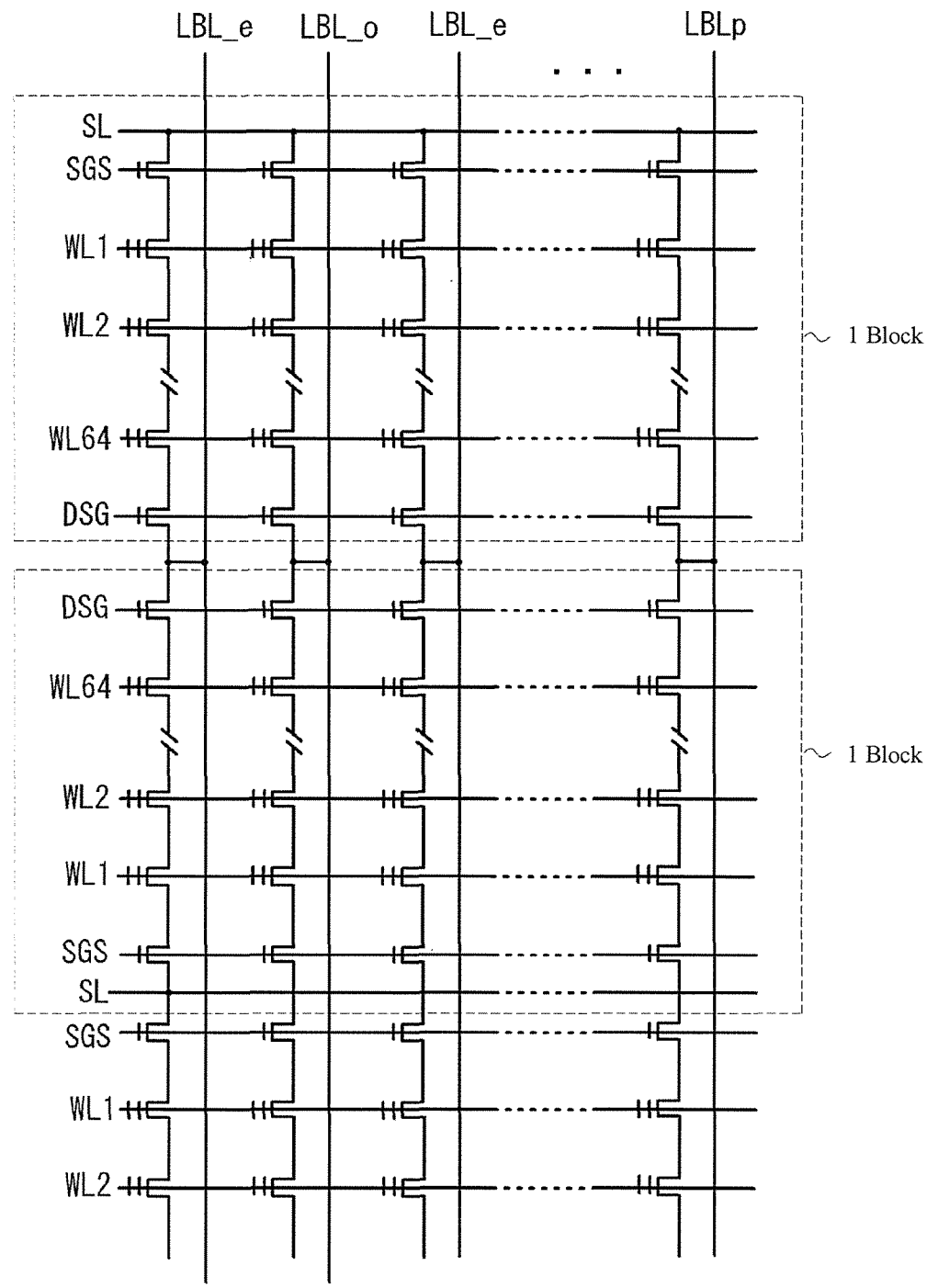
FIG. 4 is a diagram illustrating an equivalent circuit of a memory cell.

As shown in FIG. 4, a plurality of NAND strings are formed in one block BLK. One NAND string has a plurality of memory cells connected in series, a source line side selection transistor connected with one end of the memory cell, and a bit line side selection transistor connected with the other end of the memory cell. As shown in FIG. 4, one NAND string includes 64 memory cells connected in series. Namely, one block includes 64 page×p bit.

Typically, the memory cell has metal oxide semiconductor (MOS) structure, the MOS structure includes a source/drain serving as a N type diffusion region and formed in a P-well; a tunnel oxide film formed on a channel between the source and the drain; a floating gate (electric charge accumulating layer) formed on the tunnel oxide film; and a control gate formed on the floating gate with a dielectric film therebetween.

When the floating gate does not accumulate electric charge, data "1" is written, the threshold value is in a negative state, and the memory cell is normally on. When the floating gate accumulates electrons, data "0" is written, the threshold value transfers to be positive, and the memory cell is normally off.

FIG. 5 is a plane view illustrating the schematic structure of the global block. As described above, one memory plane 110A (or 110B) includes 8 global blocks G_BLK1~G_BLK8 arranged along the column direction. Beside 128 blocks arranged along the column direction, the global block further includes a first switching circuit 220 and a second switching circuit 230. The first switching circuit 220 is disposed at the top end of the global block, the second switching circuit 230 is disposed at the bottom end of the global block, and 128 blocks are disposed between the first switching circuit 220 and the second switching circuit 230. In addition, n bits global bit lines GBL are formed above a plurality of global block G_BLK1~G_BLK8, each of the global bit lines GBL1~GBLn is shared by 8 global block G_BLK1~G_BLK8 and electrically connected to the first switching circuit 220 and the second switching circuit 230 of each of the global blocks via contacts.

Figure 6:
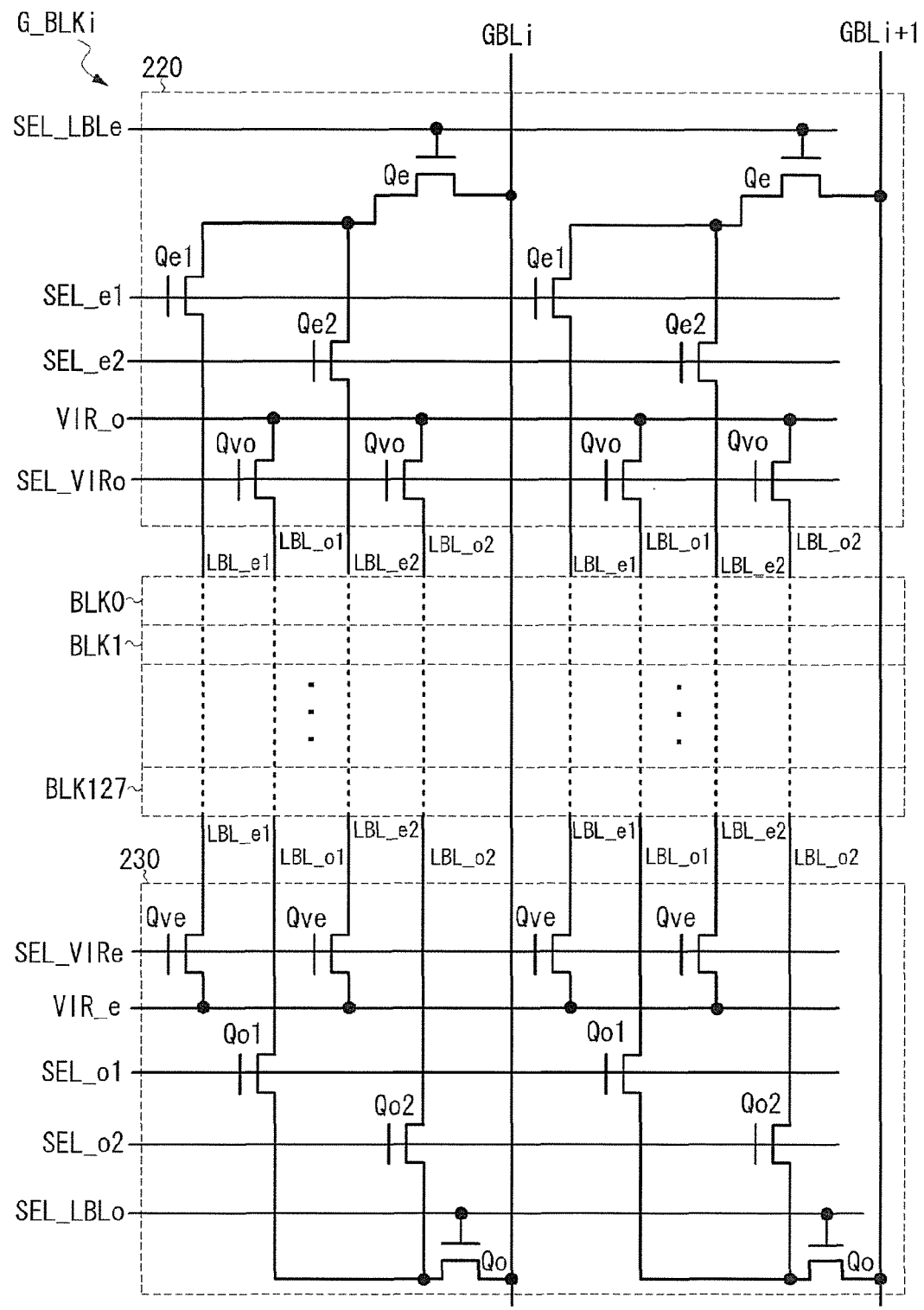
FIG. 6 is a diagram illustrating a circuit structure of switching circuits formed inside the global block of the present embodiment.

Next, FIG. 6 is a diagram illustrating the detailed circuit structure of the first switching circuit 220 and the second switching circuit 230. As a part of the structure, the ith global block G_BLKi is illustrated in FIG. 6, and the ith global bit line GBLi and the i+1th global bit line GBLi+1 are extended from above the ith global block G_BLKi. The structure related to the global bit line GBLi is the same as the structure related to the global bit line GBLi+1, thus only the global bit line GBLi is described hereinafter.

The global block G_BLKi includes 128 blocks along the column direction, one block, as shown in FIG. 4, includes a memory cell having 64 WL×p bit, one word line WL is allocated to have two pages being even-numbered and odd-numbered, thus one block has 128 pages. Each NAND string of each block is coupled to each local bit line LBL extended along the column direction. One local bit line LBL is shared by 128 blocks. Herein, under the circumstance that the local bit lines are distinguished by even-numbered and odd-numbered, a symbol "LBL_e" is used to represent the even-numbered local bit line, and a symbol "LBL_o" is used to represent the odd-numbered local bit line.

In the present embodiment, one global bit line GBLi is selectively connected to two even-numbered local bit lines LBL_e and two odd-numbered local bit lines LBL_o, in other words, one global bit line is shared by four local bit lines. Each of the global bit lines GBL is connected with a page buffer/sense circuit 170. For example, when there are n global bit lines GBL, there are n page buffer/sense circuits 170 connected with n global bit lines GBL. It is not shown in Figures but one page buffer/sense circuit 170 has latch circuits, the number of the latch circuits is corresponding to the number of local bit lines sharing one global bit line GBL (four is shown in FIG. 6), four latch circuits respectively maintain data read from the memory cells via four local bit lines LBL or respectively maintain data used for programming the memory cells via four local bit lines LBL.

The first switching circuit 220 includes N channel MOS transistors Qe, Qe1, Qe2, and Qvo. The transistor Qe connects the global bit line GBLi with the even-numbered local bit lines LBL_e1 and LBL_e2, the gate of the transistor Qe is connected to a select line SEL_LBLe, and the transistor Qe selects both the even-numbered local bit lines LBL_e1 and LBL_e2. The transistor Qe1 is serially connected between the local bit line LBL_e1 and transistor Qe, the gate of the transistor Qe1 is connected to a select line SEL_e1, the transistor Qe1 selects the even-numbered local bit line LBL_e1. The transistor Qe2 is serially connected between the local bit line LBL_e2 and transistor Qe, the gate of the transistor Qe2 is connected to a select line SEL_e2. The transistor Qe2 selects the even-numbered local bit line LBL_e2. The transistors Qvo connects an imaginary power line VIR_o with the odd-numbered local bit lines LBL_o1 and LBL_o2, and the gates of the transistors Qvo are collectively connected to a select line SEL_VIRo. The transistors Qvo provides bias voltages corresponding to operate condition to both odd-numbered local bit lines LBL_o1 and LBL_o2.

The second switching circuit 230 includes N channel MOS transistors Qo, Qo1, Qo2, and Qve. The transistor Qo connects the global bit line GBLi with the odd-numbered local bit lines LBL_o1 and LBL_o2, the gate of the transistor Qo is connected to a select line SEL_LBLo, and the transistor Qo selects both the odd-numbered local bit lines LBL_o1 and LBL_o2. The transistor Qo1 is serially connected between the local bit line LBL_o1 and the transistor Qo, the gate of the transistor Qo1 is connected to a select line SEL_o1, the transistor Qo1 selects the odd-numbered local bit line LBL_o1. The transistor Qo2 is serially connected between the local bit line LBL_o2 and transistor Qo, the gate of the transistor Qo2 is connected to a select line SEL_o2. The transistor Qo2 selects the odd-numbered local bit line LBL_o2. The transistors Qve connects an imaginary power line VIR_e with the even-numbered local bit lines LBL_e1 and LBL_e2, and the gates of the transistors Qve are collectively connected to a select line SEL_VIRe. The transistors Qve provides bias voltages corresponding to operate condition to both even-numbered local bit lines LBL_e1 and LBL_e2.

FIG. 7 is a schematic cross-sectional view of the global block. In one example, an N-well 310 is formed in a p-type silicon substrate 300, and a P-well 320 is formed in the N-well 310. Furthermore, P-wells 322 and 324 separate from the P-well 320 are formed in the p-type silicon substrate 300. The main part of one global block G_BLKi is formed in the P-well 320. The transistor Qe of the first switching circuit 220 is formed in the P-well 322 separate from the P-well 320, the transistor Qo of the second switching circuit 230 is formed in the P-well 324. In a preferred embodiment, the memory cells of each block and each of the transistors of the first switching circuit 220 and the second switching circuit 230 formed in the P-well 320 are formed by the same manufacturing process. Therefore, the micro machining similar to the micro machining that is performed on the memory cell is performed on the transistors of the first switching circuit 220 and the second switching circuit 230. On the other hand, the transistors Qe and Qo formed in the P-wells 320 and 324 are coupled between one global bit line and four local bit lines, when the transistors Qe and Qv is in the erase operation, the P-well 320 of the global block is blocked when the voltage state of the P-well 320 becomes a high voltage state, so as to prevent the global bit line GBL from having a high voltage. Otherwise, the impurity concentration of the P-wells 322 and 324 is either the same as the impurity concentration of the P-well 320 or different from the impurity concentration of the P-well 320 according to requirements.

The local bit line LBL is connected to the drain of the bit line side selection transistor of each block, the local bit line LBL includes, for example, a first level metal line (M0). Moreover, the interconnection between a first switching circuit 220' and the transistor Qe and the interconnection between a second switching circuit 230' and the transistor Qo as the same as the local bit line LBL, such as including first level metal lines L1 and L2. The imaginary power lines VIR_o and VIR_e include, for example, a second level metal line (M1), the global bit line GBLi includes, for example, a third level metal line (M2). In particular, the ideal resistance of the metal line forming the global bit line GBLi is as small as possible and reduce the capacitance between adjacent global bit lines.

Figure 8A:
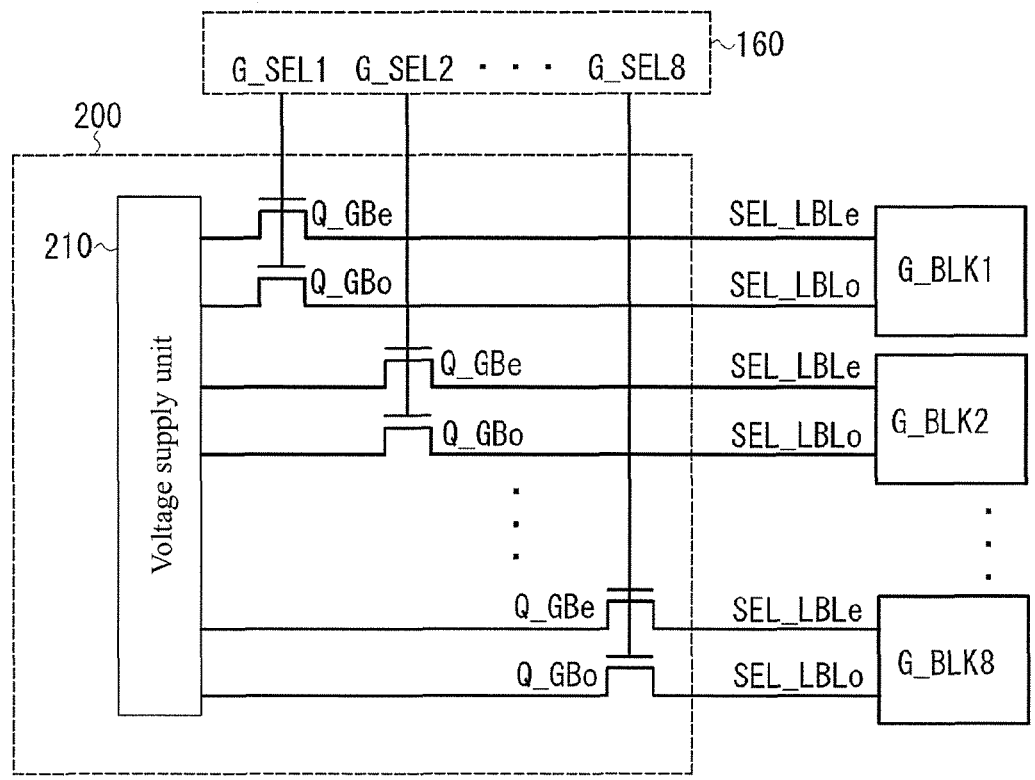
FIG. 8(A) is a diagram illustrating an exemplary structure of a row decoder used for selecting the global block in the present embodiment.

FIG. 8(A) is a diagram illustrating an exemplary structure of a row decoder 200 used for selecting the global block G_BLKi. The row drive circuit 200 includes 8 pairs of N type global block selecting transistors Q_GBe and Q_GBo connected to select lines SEL_LBLe and SEL_LBLo of each global block. Each of select lines G_SEL1, G_SEL2, ..., G_SEL8 is provided from the row decoder 160 to the gates of each pair of global block selecting transistors Q_GBe and Q_GBo so as to select a global block. The row decoder 160 is based on the row address data Ax to set one of the select lines G_SEL1, G_SEL2, ..., G_SEL8 as H level (high level) (to turn on the global block selecting transistor) and to set the remaining select lines as L level (low level) (to turn off the global block selecting transistors), so the select lines SEL_LBLe and SEL_LBLo of the selected global block are electrically coupled to a voltage supply unit 210 of the row drive circuit 200. The voltage supply unit 210 provides voltages corresponding to operate condition to the select lines SEL_LBLe and SEL_LBLo of the selected global block.

Figure 8B:
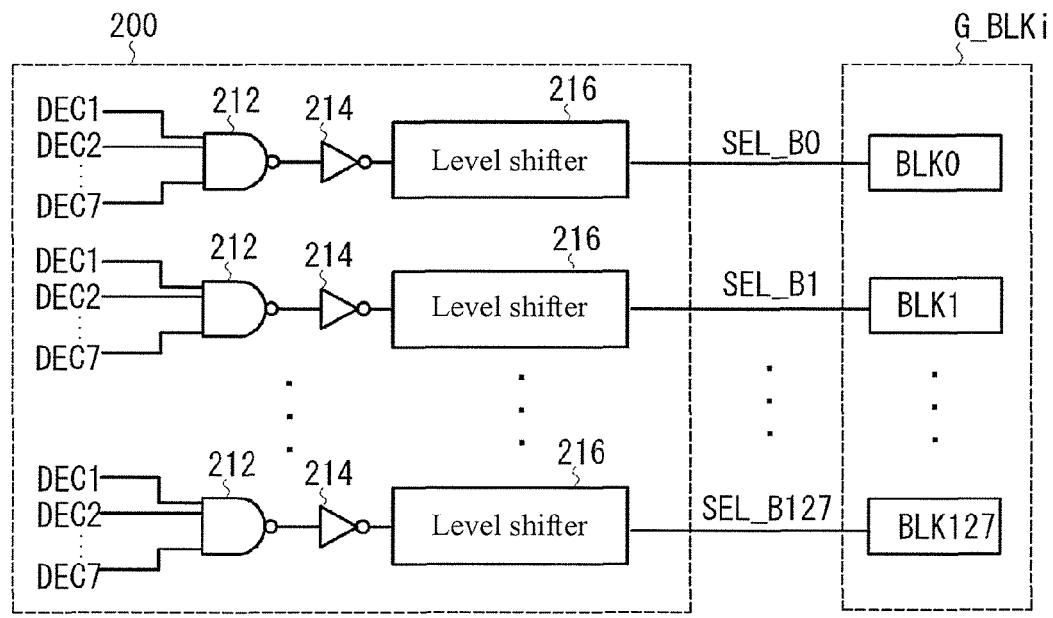
FIG. 8(B) is a diagram illustrating an exemplary structure of a row decoder used for selecting the block in the present embodiment.

FIG. 8(B) is a diagram illustrating an exemplary structure of the row decoder 200 used for selecting the block inside the global block. The row drive circuit 200 includes 128 groups, and one group includes a NAND gate 212, an inverter 214, and a level shifter 216. The row decoder 160 inputs 7 decoding signals DEC1, DEC2, . . . , DEC7 used for selecting block from the row decoder 160 to each of the NAND gates 212, and an output of any one of the NAND gates 212 is L level. The output of the NAND gate 212 enables the level shifter 216 via the inverter 214 and drives one of block selecting lines SEL_B0, SEL_B1, SEL_B2, . . . , SEL_B127 to H level. It is not shown in Figures but each block includes N type block selecting transistors, and the gates of the block selecting transistors are connected to the block selecting lines SEL_B0, SEL_B1, SEL_B2, . . . , SEL_B127. Moreover, the row drive circuit 200 provides voltages corresponding to operate conditions to select gate lines SGS and DSG, word lines WL1~WL64, a source line SL, the select lines SEL_e1, SEL_e2, SEL_VIRe, SEL_VIRo, SEL_o1, SEL_o2, and SEL_LBLo, the imaginary power lines VIR_o and VIR_e shown in FIGS. 4 and 6.

Next, the operations of the flash memory in the present embodiment is described. Table 1 represents the bias voltage of each part in erase operation. In the selected global block, a voltage Vdd is provided to the global bit line GBLi and the select lines SEL_LBLe and SEL_LBLo, otherwise, the select lines SEL_e1, SEL_e2, SEL_o1, SEL_o2, SEL_VIRe, and SEL_VIRo, and the bit lines LBLe and LBLo are set as floating, and the erase voltage 20V is applied to the P-well. In addition, L level (or 0V) is provided to the select lines SEL_LBLe and SEL_LBLo of the non-selected global blocks, the other select lines are set as floating.

Erase Operation

TABLE 1

| GBLi | Vdd | — | — | — |
| SEL_LBLe | Vdd | L | — | — |
| SEL_LBLo | Vdd | L | — | — |
| SEL_e1 | F | F | — | — |
| SEL_e2 | F | F | — | — |
| SEL_o1 | F | F | — | — |
| SEL_o2 | F | F | — | — |
| SEL_VIRe | F | F | — | — |
| SEL_VIRo | F | F | — | — |
| LBLe | F | F | — | — |
| LBLo | F | F | — | — |
| W/L | — | — | 0 V | F |
| DSG | — | — | F | F |
| SGS | — | — | F | F |
| SL | — | — | F | F |
| | 20 V | — | 20 V | 20 V |

Figure 9:
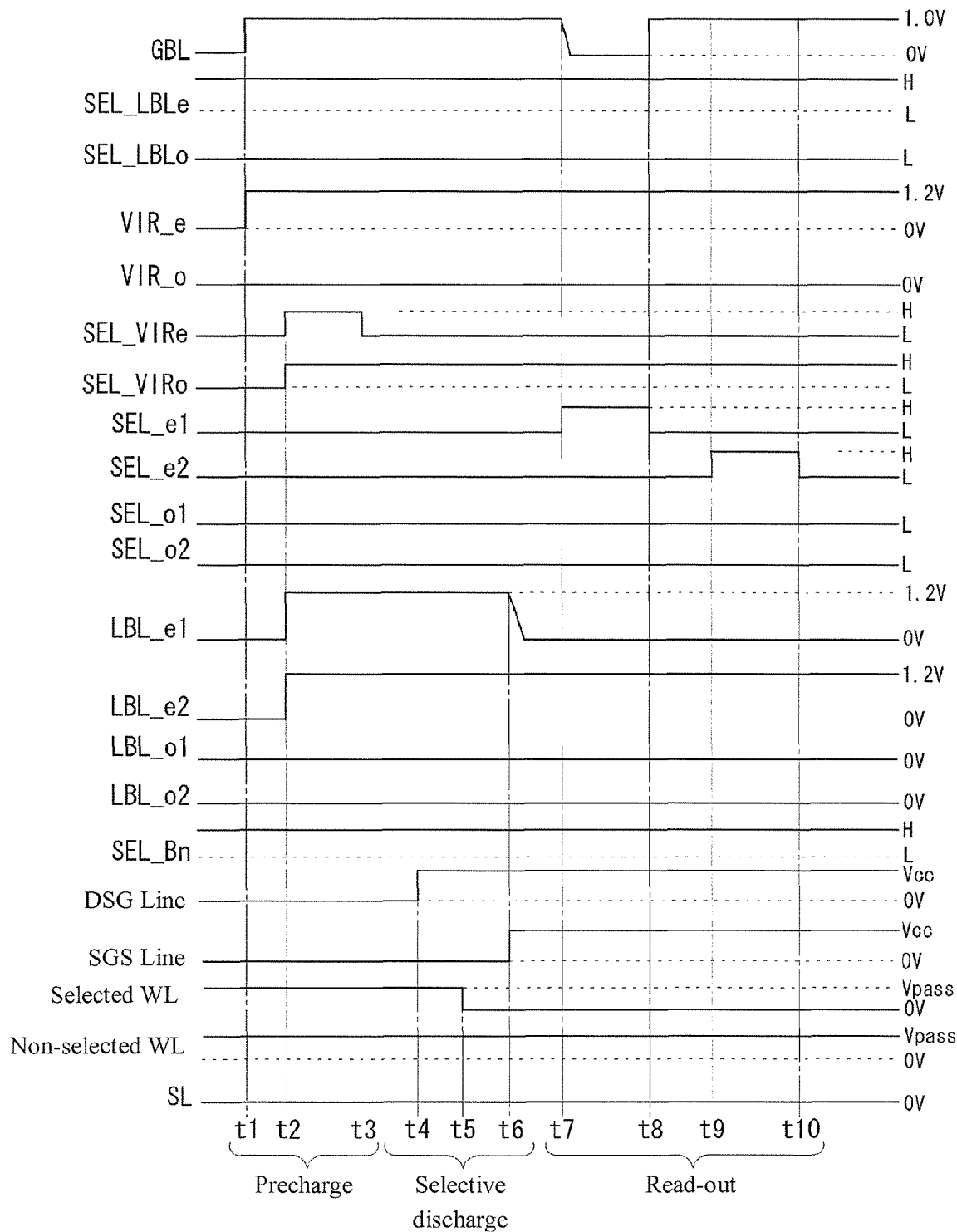
FIG. 9 is a timing diagram of a read-out operation of an even-numbered page in the present embodiment.

A voltage 0V is applied to the word line WL of the selected block, the select lines DSG and SGS and the source line SL are set as floating, and the word lines WL, the select lines DSG and SGS, and the source lines SL of the non-selected blocks are set as floating. In this way, the flash memory of the present embodiment is the same as the conventional flash memory that a block is a unit which is erased as a whole. Next, the read-out operation is simply described. As a preferred pattern, the read-out operations of the selected even-numbered page and the selected odd-numbered page are sequentially executed by the flash memory of the present embodiment. Table 2 represents bias voltages of each part when the read-out operation of the even-numbered page is executed, FIG. 9 is a timing diagram illustrating the read-out operation of the even-numbered page when data "1" is stored in the memory cell of the even-numbered local bit line LBL_e1 and data "0" is stored in the memory cell of the even-numbered local bit line LBL_e2.

Read-Out Operation

TABLE 2

| Read-out of even-numbered page | Precharge period | Discharge period of string | Read-out period |
| --- | --- | --- | --- |
| GBLi | 1.0 V | 1.0 V | Electric charge shared by LBL/GBL |
| Qve | Turned on | Turned off | Turned off |
| Qvo | Turned on | Turned on | Turned off |
| LBLe | 1.2 V | 1.2 V → Discharge | Discharge → Sharing electric charge |
| LBLo | 0 V | 0 V | 0 V |
| Qe1/Qe2 | Turned off | Turned off | Successively enabling Qe1/Qe2 |
| Qo1/Qo2 | Turned off | Turned off | Turned off |
| Qe | Turned on | Turned on | Turned on |
| Qo | Turned off | Turned off | Turned off |
| Block selecting Tr | Turned on | Turned on | Turned on |
| Selected WL | Pass Voltage | 0 V | 0 V/Vcc |
| Non-selected WL | Pass Voltage | Pass Voltage | Pass Voltage |
| Bit line side Tr | Turned off | Turned on | Turned off |
| Source line side Tr | Turned off | Turned on | Turned off |
| SL | 0 V | 0 V | 0 V |

The read-out operation includes a precharge period, a selective discharge period of the string, and a read-out period. Firstly, at the time t1 of the precharge period, the global block selecting transistors Q_GBe and Q_GBo configured to select the global block are set as turned on (FIG. 8(A)), the voltage supply unit 210 provides an H level voltage to the select line SEL_LBLe via the turned on global block selecting transistor Q_GBe and provides a 0V to the select line SEL_LBLo via the global block selecting transistor Q_GBo. Therefore, the transistor Qe is turned on, and the transistor Qo is turned off. In addition, the page buffer/sense circuit 170 provides a precharge voltage, such as 1.0V, to all of the global bit lines GBL. Then, the row drive circuit 200 provides a precharge voltage, such as 1.2V, to the imaginary power line VIR_e and provides 0 V to the imaginary power line VIR_o.

Next, at the time t2, the row drive circuit 200 drives the select lines SEL_VIRe and SEL_VIRo to H level in a fixed period. Therefore, the transistors Qve and Qvo are turned on, the two even-numbered local bit lines LBL_e1 and LBL_e2 are precharged to 1.2V, and the two odd-numbered local bit lines LBL_o1 and LBL_o2 are set as 0V. When the read-out operation of the even-numbered page is executed, the even-numbered page is masked by the odd-numbered page that is connected to the ground, the noise caused by capacitive coupling between the bit lines is suppressed. At the time t3, the select lines SEL_VIRe is driven to L level, the even-numbered local bit line LBLe and the odd-numbered local bit lines LBLo are separate from the imaginary power lines VIR_e and VIR_o, the precharge period is completed.

Next, at the time t4~t6, the selective discharge period of the string is started. At the time t4, the select line DSG is driven to Vcc, the bit line side select transistor is turned on. A voltage, such as a pass voltage Vpass, that is able to turn on a memory cell having data "0" is provided to the selected word line WL and the non-selected word line WL, and 0V is provided to the source line SL. At this time, the memory cell of the string of the selected block is charged by the electric charge from the even-numbered local bit line LBLe.

Next, at the time t5, the selected word line WL is driven to 0V. Next, at the time t6, the select line SGS is driven from 0V to Vcc, the source line side select transistor is turned on. Therefore, according to the storage status of the data of the memory cell, the electric charge of the string and the even-numbered local bit line LBLe is discharged to the source line SL. Since data "1" is stored in the selected memory cell connected to the local bit line LBL_e1, the selected memory cell is turned on and the local bit line LBL_e1 is discharged to the GND electric potential. On the other hand, since data "0" is stored in the selected memory cell connected to the local bit line LBL_e2, the selected memory cell is turned off and the precharge voltage of the local bit line LBL_e2 is maintained. That is, in the discharge period of the string, the electric charge corresponding to the storage status of the memory cell is maintained in the even-numbered local bit lines LBL_e1 and LBL_e2.

Next, at the time t7~t10, the read-out operation is executed. From the time t7 to the time t8, the select line SEL_e1 is driven to H level. In this period, the transistor Qe1 is turned on, the even-numbered local bit line LBL_e1 is connected to the global bit line GBL. Since the even-numbered local bit line LBL_e1 is 0V, the electric potential of the global bit line GBL is discharged to 0V. The page buffer/sense circuit 170 detects the electric potential or the current of the global bit line GBL and maintains the result in the latch circuit.

In the period from the time t7 to the time t8, when the read-out operation of the even-numbered local bit line LBL_e1 is completed, the page buffer/sense circuit 170 precharges the global bit line GBL again in the period from the time t8 to the time t9. Subsequently, in the period from the time t9 to the time t10, the select line SEL_e2 is driven to H level. In this period, the transistor Qe2 is turned on, the even-numbered local bit line LBL_e2 is connected to the global bit line GBL. Since the precharge voltage of the even-numbered local bit line LBL_e2 is maintained, the electric potential of the global bit line GBL is almost not changed. The page buffer/sense circuit 170 detects the electric potential or the current of the global bit line GBL and maintains the result in the latch circuit.

Figure 10:
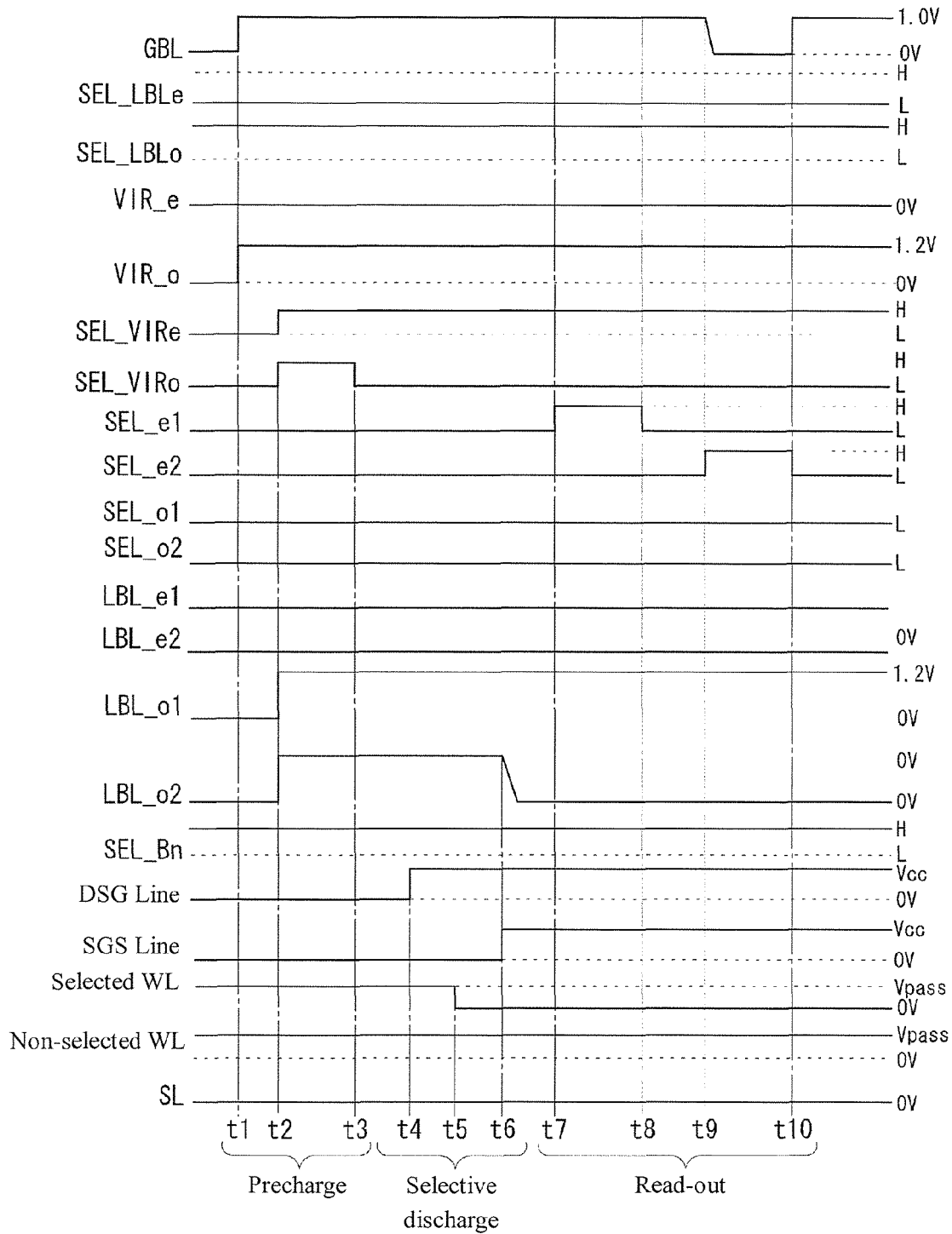
FIG. 10 is a timing diagram of a read-out operation of an odd-numbered page in the present embodiment.
Figure 11:
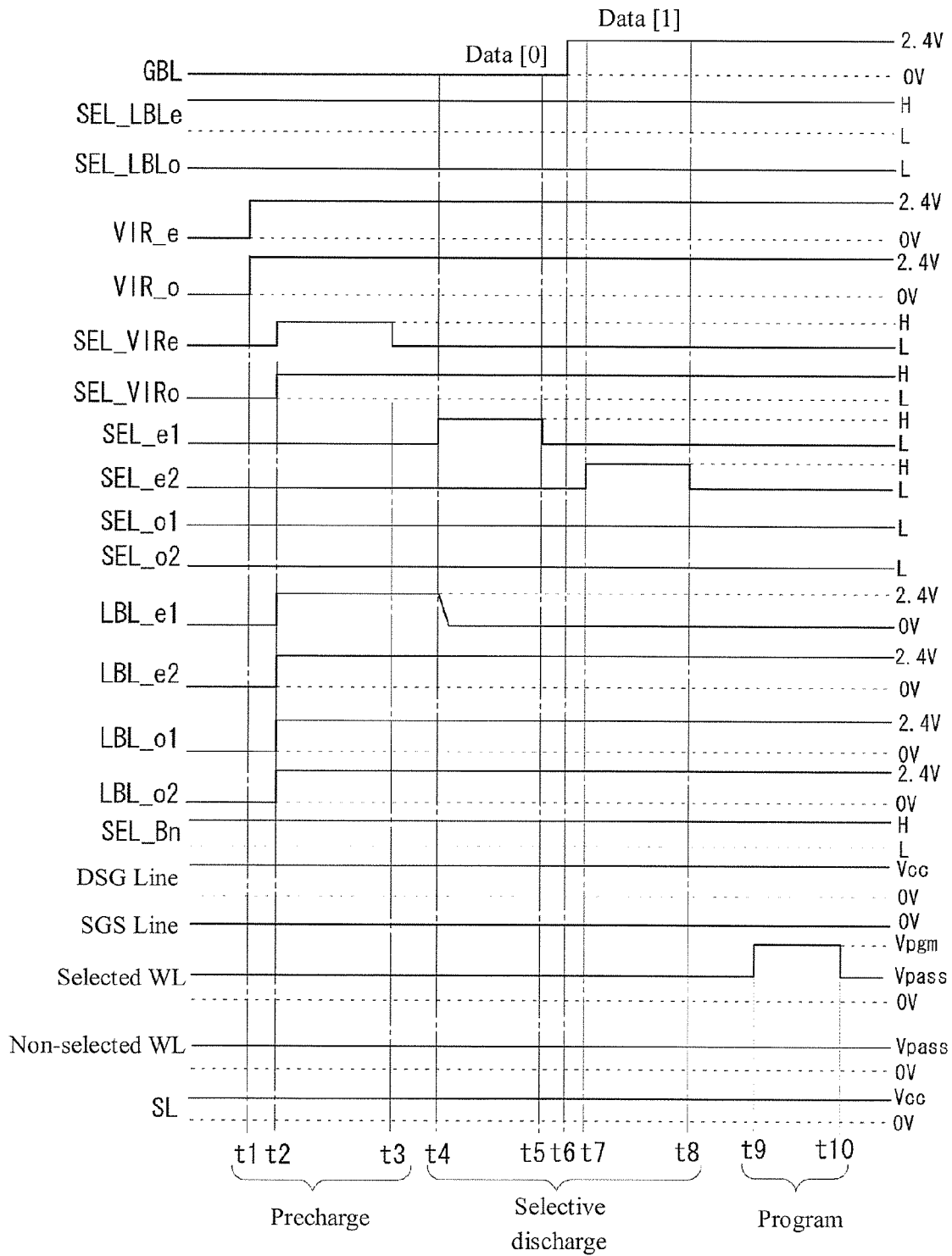
FIG. 11 is a timing diagram of a program operation of an even-numbered page in the present embodiment.

As a result, when the read-out operation of the selected memory cell of the two even-numbered local bit lines LBL_e1 and LBL_e2 is completed, the read-out operation of the two odd-numbered local bit lines is executed next. FIG. 10 is a timing diagram illustrating the read-out operation of the odd-numbered page when data "0" is stored in the memory cell of the odd-numbered local bit line LBL_o1 and data "1" is stored in the memory cell of the odd-numbered local bit line LBL_o2. These operations are the same as the operations in the read-out operation of the even-numbered local bit lines LBLe. Next, the program operation is described. As a preferred pattern, the program operations of the selected even-numbered page and the selected odd-numbered page of are sequentially executed by the flash memory of the present embodiment. Table 3 represents bias voltages of each part when the program operation of the even-numbered page is executed, FIG. 11 is a timing diagram illustrating the program operation of the even-numbered page when data "0" is stored in the memory cell of the even-numbered local bit line LBL_e1 and data "1" is stored in the memory cell of the even-numbered local bit line LBL_e2.

Program Operation

TABLE 3

| Program of even-numbered page | Precharge Period | Discharge period of string | Program period |
|---|---|---|---|
| GBL | 0 V | 2.6 V/0 V | 2.4 V |
| Qve | Turned on | Turned off | Turned off |
| Qvo | Turned on | Turned on | Turned on |
| LBL_e | 2.4 V | 2.4 V/0 V | 2.4 V/0 V |
| LBL_o | 2.4 V | 2.4 V | 2.4 V |
| Qe1/Qe2 | Turned off | Successively turning on Qe1/Qe2 | Turned off |
| Qo1/Qo2 | Turned off | Turned off | Turned off |
| Qe | Turned on | Turned on | Turned on |
| Qo | Turned off | Turned off | Turned off |
| Block selecting Tr | Turned on | Turned on | Turned on |
| Selected WL | Pass Voltage | Pass Voltage | 15~20 V |
| Non-selected WL | Pass Voltage | Pass Voltage | Pass Voltage |
| Bit line side Tr | Turned on | Turned on | Turned on |
| Source line side Tr | Turned off | Turned off | Turned off |
| SL | Vcc | Vcc | Vcc |
| P-Well | 0 V | 0 V | 0 V |

The program operation includes a precharge period, a selective discharge period of the string, and a program period. Firstly, at the time t1 of the precharge period, the global block selecting transistors Q_GBe and Q_GBo configured to select the global block are set as turned on (FIG. 8(A)), the voltage supply unit 210 provides an H level voltage to the select line SEL_LBLe via the turned on global block selecting transistor Q_GBe and provides a 0V to the select line SEL_LBLo via the global block selecting transistor Q_GBo. Therefore, the transistor Qe is turned on, and the transistor Qo is turned off. The page buffer/sense circuit 170 provides a 0V voltage to the global bit lines GBL. Then, the row drive circuit 200 provides a precharge voltage, such as 2.4 V, to the imaginary power lines VIR_e and VIRo. In addition, the select line DSG is driven to Vcc, the bit line side transistor is turned on, the select line SGS is driven to 0V, and the source line side transistor is turned off. The selected word line WL and the non-selected word line WL is driven to pass voltage Vpass. In addition, Vcc is provided to the source line SL.

Next, at the time t2, the row drive circuit 200 drives the select lines SEL_VIRe and SEL_VIRo to H level. Therefore, all of the transistors Qve are turned on and the two even-numbered local bit lines LBL_e1 and LBL_e2 are precharged to 2.4 V, furthermore, the transistors Qvo are turned on and the two odd-numbered local bit lines LBL_o1 and LBL_o2 are precharged to 2.4 V. That is, when the program operation of the even-numbered page is executed, the even-numbered page is masked by the odd-numbered page that is precharged to the same electric potential, and the noise caused by capacitive coupling between the bit lines is suppressed. At the time t3, the select line SEL_VIRe is driven to L level, the even-numbered local bit line LBLe is separate from the imaginary power line VIR_e, the precharge period is completed. Otherwise, the odd-numbered local bit lines LBLo are kept connecting to the imaginary power line VIR_o.

Next, at the time t4~t8, the selective discharge period of the string is started. The page buffer/sense circuit 170 maintains the program data, and the page buffer/sense circuit 170 connected to a global bit line GBL maintains a program data having 4 bits.

At the time t4, the page buffer/sense circuit 170 set the voltage of the global bit line GBL as a voltage corresponding to an initial bit of the program data. Since data "0" is stored in the memory cells connected to the even-numbered local bit line LBL_e1, the program operation is executed, thus the page buffer/sense circuit 170 sets the voltage of the global bit line GBL as 0V. Subsequently, in the period from the time t4 to the time t5, the select line SEL_e1 is driven to H level. Therefore, the transistors Qe1 are turned on, the even-numbered local bit line LBL_e1 is connected to the global bit line GBL, the even-numbered local bit line LBL_e1 is discharged to 0V.

Next, at the time t6, the page buffer/sense circuit 170 set the voltage of the global bit line GBL as a voltage corresponding to a next bit of the program data. Since program data "1" is programmed in the memory cell connected to the even-numbered local bit line LBL_e2, the program operation is prohibited, thus the global bit line GBL is set as 2.4V to prohibit a write operation. From the time t7 to the time t8, the select line SEL_e2 is driven to H level. Therefore, the transistor Qe2 is turned on, the even-numbered local bit line LBL_e2 is connected to the global bit line GBL, but the voltage of the even-numbered local bit line LBL_e1 is maintained about 2.4 V. As a result, the program data is maintained in the even-numbered local bit lines LBL_e1 and LBL_e2.

Next, in the time t9~t10, the program operation is executed. That is, the program voltage about 15V~20V is applied to the selected word line. Therefore, data "0" is programmed in the selected memory cell connected to the even-numbered local bit line LBL_e1, and data "1" is maintained in the selected memory cell connected to the even-numbered local bit line LBL_e2.

Figure 12:
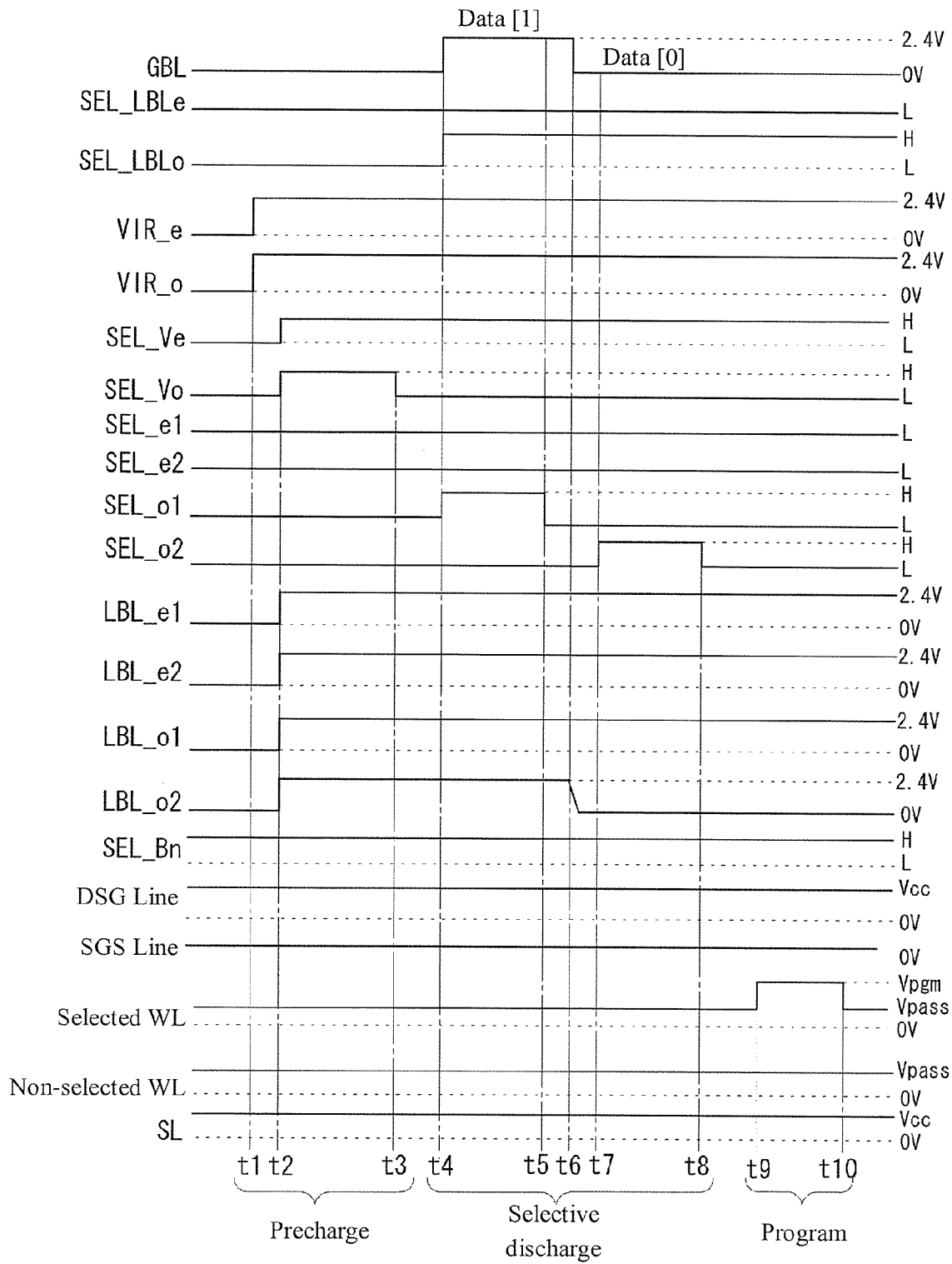
FIG. 12 is a timing diagram of a program operation of an odd-numbered page in the present embodiment.

As a result, when the program operation of the selected memory cells of the two even-numbered local bit lines LBL_e1 and LBL_e2 is completed, the two odd-numbered local bit lines LBL_o1 and LBL_o2 are programmed next. FIG. 12 is a timing diagram illustrating the program operation of the odd-numbered page when data "1" is programmed in the memory cell connected to the odd-numbered local bit line LBL_o1 and data "0" is programmed in the memory cell connected to the odd-numbered local bit line LBL_o2. When the selective discharge operation of the string is executed, the page buffer/sense circuit 170 sets the voltage of the global bit line GBL as a voltage corresponding to the third bit of the program data and the fourth bit of the program data. The other program operations are the same as the program operation of the even-numbered local bit lines LBLe.

Thus, according to the present embodiment, as long as one global bit line and the plurality of local bit lines are separate from each other, when the read-out/program operation is executed, charging and discharging the local bit lines in the selected global block are sufficient, so as to reduce power consumption. Furthermore, the electric charge corresponding to data is temporarily maintained in the local bit lines in the selected global block, the local bit lines are time-sharingly connected to the global bit line, so as to achieve a high speed read-out operation and a high speed program operation. In addition, the plurality of global blocks are formed in the memory plane, the plurality of blocks are formed in each of the global blocks, thereby achieving a high-integrated memory plane.

In the above-mentioned embodiment, the structure that the two even-numbered local bit lines and the two odd-numbered local bit lines are collectively connected to one global bit line GBL is represented, but the invention is not limited to this structure. More than m (m is a natural number greater than 3) even-numbered local bit lines and m odd-numbered local bit lines may be collectively connected to one global bit line GBL. For example, four even-numbered local bit lines and four odd-numbered local bit lines are collectively connected to one global bit line, thus one global bit line is shared by eight local bit lines. The increase of the number of the sharing local bit lines means that the electric charge (data) maintained in the local bit lines is increased, and the plurality of local bit lines are rapidly and time-sharingly connected to the global bit line, so as to further achieve a high speed read-out operation and a high speed program operation.

In the above-mentioned embodiment, the structure that the plurality of even-numbered local bit lines and the plurality of odd-numbered local bit lines are collectively connected to one global bit line is represented, but the invention is not limited to this structure. Under the circumstance that the read-out operation and the program operation are executed when the bit lines are not divided into even-numbered bit lines and odd-numbered bit lines, simply, a plurality of local bit lines are collectively connected to one global bit line regardless of even-number and odd-number, so one global bit line is shared by a plurality of local bit lines.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A non-volatile semiconductor memory device, comprising:
   a memory array, comprising a plurality of global blocks, the one global block comprises a plurality of blocks, and the one block comprises a plurality of NAND type strings;
   a plurality of local bit lines, collectively connected to each of the plurality of blocks in the one global block;
   a plurality of global bit lines, shared by the plurality of global blocks; and
   a connecting element, selectively connecting the one global bit line to the m local bit lines, wherein m is an integer greater than 2,
   and when a read-out operation or a program operation of a selected page is executed in a selected block in the global block, the m local bit lines share the one global bit line via the connecting element,
   wherein the local bit line comprises a plurality of even-numbered local bit lines and a plurality of odd-numbered local bit lines, the connecting element comprises an even-numbered connecting element selectively connecting the plurality of even-numbered local bit lines to the global bit line and an odd-numbered connecting element connecting the plurality of odd-numbered local bit lines to the global bit line.

2. The non-volatile semiconductor memory device as recited in claim 1, wherein the connecting element time-sharingly connects the plurality of local bit lines to the global bit line.

3. The non-volatile semiconductor memory device as recited in claim 1, wherein the connecting element is configured in each of the plurality of global blocks.

4. The non-volatile semiconductor memory device as recited in claim 1, wherein the even-numbered connecting element time-sharingly connects the plurality of even-numbered local bit lines to the global bit line, and the odd-numbered connecting element time-sharingly connects the plurality of odd-numbered local bit lines to the global bit line.

5. The non-volatile semiconductor memory device as recited in claim 1, wherein the connecting element further comprises an even-numbered supplying element providing a bias voltage to the plurality of even-numbered local bit lines, and an odd-numbered supplying element providing the bias voltage to the plurality of odd-numbered local bit lines.

6. The non-volatile semiconductor memory device as recited in claim 5, wherein when the read-out operation of the even-numbered local bit line is executed, the odd-numbered supplying element provides a mask voltage to the odd-numbered local bit line, when the read-out operation of the odd-numbered local bit line is executed, the even-numbered supplying element provides the mask voltage to the even-numbered local bit line.

7. The non-volatile semiconductor memory device as recited in claim 5, wherein the connecting element comprises a first connecting element and a second connecting element, the first connecting element comprises the even-numbered connecting element and the even-numbered supplying element, the second connecting element comprises the odd-numbered connecting element and the odd-numbered supplying element, the first connecting element is disposed at one of end sides of the global block, the second connecting element is disposed at another one of the end sides of the global block, and the plurality of blocks are configured between the first connecting element and the second connecting element.

8. The non-volatile semiconductor memory device as recited in claim 7, wherein the first connecting element comprises a first even-numbered select transistor collectively selecting the plurality of even-numbered local bit lines and a second even-numbered select transistor selecting each of the plurality of even-numbered local bit lines, the second even-numbered select transistor is serially connected to the first even-numbered select transistor, the second connecting element comprises a first odd-numbered select transistor collectively selecting the plurality of odd-numbered local bit lines and a second odd-numbered select transistor selecting each of the plurality of odd-numbered local bit lines, and the second odd-numbered select transistor is serially connected to the first odd-numbered select transistor.

9. The non-volatile semiconductor memory device as recited in claim 8, wherein the plurality of blocks of the global block, the second even-numbered select transistor, and the second odd-numbered select transistor are formed in a first well region of a first type of conductivity formed on a substrate, the first even-numbered select transistor and the first odd-numbered select transistor are formed in a second well region of the first type of conductivity separated from the first well region.

10. The non-volatile semiconductor memory device as recited in claim 5, further comprising:
a read-out element, executing the read-out operation of the selected page of the selected block,
wherein the read-out element controls a precharge operation, a selective discharge operation of the strings, and the read-out operation.

11. The non-volatile semiconductor memory device as recited in claim 10, wherein, in the precharge operation, when the read-out operation of the even-numbered local bit line is executed, the even-numbered supplying element provides a precharge voltage to the even-numbered local bit line, and when the read-out operation of the odd-numbered local bit line is executed, the odd-numbered supplying element provides the precharge voltage to the odd-numbered local bit line.

12. The non-volatile semiconductor memory device as recited in claim 10, wherein, in the precharge operation, a precharge voltage is provided to the global bit line.

13. The non-volatile semiconductor memory device as recited in claim 10, wherein, in the selective discharge operation, a read-out voltage is applied to a selected word line, a pass voltage is applied to a non-selected word line, so a bit line side transistor and a source line side transistor are turned on, the selective discharge operation of the pre-charged local bit lines is executed, and the local bit lines maintain electric potentials corresponding to data stored by memory cells.

14. The non-volatile semiconductor memory device as recited in claim 10, wherein, in the read-out operation, the selected local bit line is connected to the global bit line.

15. The non-volatile semiconductor memory device as recited in claim 5, further comprising:
a program element, executing the program operation of the selected page of the selected block,
wherein the program element controls a precharge operation, a selective discharge operation of the strings, and the program operation.

16. The non-volatile semiconductor memory device as recited in claim 15, wherein, in the precharge operation, when the program operation of the even-numbered local bit line is executed, the even-numbered supplying element and the odd-numbered supplying element provide a precharge voltage to the even-numbered local bit line and the odd-numbered local bit line.

17. The non-volatile semiconductor memory device as recited in claim 15, wherein, in the precharge operation, when the program operation of the odd-numbered local bit line is executed, the even-numbered supplying element and the odd-numbered supplying element provide a precharge voltage to the even-numbered local bit line and the odd-numbered local bit line.

18. The non-volatile semiconductor memory device as recited in claim 16, wherein, in the precharge operation, a bit line side select transistor is turned on, a source line side select transistor is set as turned off, a pass voltage is applied to a selected word line and a non-selected word line.

19. The non-volatile semiconductor memory device as recited in claim 15, wherein, in the selective discharge operation, a voltage corresponding to data to be programmed is provided to the global bit line, when the program operation of the even-numbered local bit line is executed, the even-numbered local bit line is time-sharingly connected to the global bit line and the even-numbered local bit line is selectively discharged, when the program operation of the odd-numbered local bit line is executed, the odd-numbered local bit line is time-sharingly connected to the global bit line and the odd-numbered local bit line is selectively discharged.

20. The non-volatile semiconductor memory device as recited in claim 1, further comprising:
an erase element, erasing data in a unit, wherein the unit is the block selected by a select element.

21. The non-volatile semiconductor memory device as recited in claim 1, wherein
the non-volatile semiconductor memory device further comprises:
a global block selecting element, based on an address information to select the global block in the memory array;

a block selecting element, based on the address information to select the block from the selected global block; and a maintain element, connected to the plurality of global bit lines, maintaining read-out data or data to be programmed.

* * * * *